United States Patent
Zhang et al.

(10) Patent No.: US 10,954,602 B1
(45) Date of Patent: Mar. 23, 2021

(54) METHOD OF ELECTRO-CHEMICAL PLATING

(71) Applicant: United Semiconductor (Xiamen) Co., Ltd., Fujian (CN)

(72) Inventors: Shouguo Zhang, Singapore (SG); Jinggang Li, Singapore (SG); Yongbo Xu, Xia Men (CN); Xijun Guo, Singapore (SG); Pao-Chung Lee, Xiamen (CN)

(73) Assignee: United Semiconductor (Xiamen) Co., Ltd., Xiamen (CN)

( * ) Notice: Subject to any disclaimer, the term of this patent is extended or adjusted under 35 U.S.C. 154(b) by 0 days.

(21) Appl. No.: 16/683,225

(22) Filed: Nov. 13, 2019

(30) Foreign Application Priority Data

Oct. 25, 2019 (CN) .......................... 201911021499.3

(51) Int. Cl.
| | |
|---|---|
| *C25D 7/12* | (2006.01) |
| *C25D 3/38* | (2006.01) |
| *C25D 17/00* | (2006.01) |
| *C25D 21/02* | (2006.01) |
| *C25D 21/16* | (2006.01) |
| *H01L 21/288* | (2006.01) |
| *C25D 17/06* | (2006.01) |

(52) U.S. Cl.
CPC ................ *C25D 7/12* (2013.01); *C25D 3/38* (2013.01); *C25D 17/001* (2013.01); *C25D 17/004* (2013.01); *C25D 17/06* (2013.01); *C25D 21/02* (2013.01); *C25D 21/16* (2013.01); *H01L 21/2885* (2013.01)

(58) Field of Classification Search
CPC ......... C25D 21/02; C25D 21/16; C25D 21/18
See application file for complete search history.

(56) References Cited

U.S. PATENT DOCUMENTS

| | | | | |
|---|---|---|---|---|
| 6,379,520 | B1* | 4/2002 | Kuriyama | C25D 17/001 205/81 |
| 6,685,817 | B1* | 2/2004 | Mathieu | H01L 21/4853 205/137 |
| 7,476,306 | B2* | 1/2009 | Su | C25D 17/02 204/241 |
| 8,012,330 | B2* | 9/2011 | Kawakami | C25D 5/02 205/96 |
| 2009/0038947 | A1* | 2/2009 | Dubin | C25D 5/00 205/101 |
| 2011/0073469 | A1* | 3/2011 | Ma | C25D 17/001 204/270 |
| 2011/0083965 | A1* | 4/2011 | Reid | C25D 21/18 205/101 |
| 2012/0024713 | A1* | 2/2012 | Preisser | C25D 3/38 205/123 |

* cited by examiner

*Primary Examiner* — Brian W Cohen
(74) *Attorney, Agent, or Firm* — Winston Hsu

(57) ABSTRACT

A method of electro-chemical plating is disclosed. The catholyte is delivered to the cathode chamber. The catholyte is controlled at a first temperature before flowing into the cathode chamber. The anolyte is provided at room temperature. The temperature of the anolyte is lowered from the room temperature to a second temperature before delivering into the anode chamber. The second temperature is equal to or lower than the first temperature. The plating surface of the substrate is immersed in the electrolyte. The substrate is biased to a direct current (DC) voltage. The biased substrate attracts ions of the metal in the electrolyte toward the plating surface so as to electroplating the metal onto the substrate.

12 Claims, 2 Drawing Sheets

METHOD OF ELECTRO-CHEMICAL PLATING

BACKGROUND OF THE INVENTION

1. Field of the Invention

The invention relates to the field of semiconductor process technology, in particular to an electro-chemical plating (ECP) process technology.

2. Description of the Prior Art

Recent advances in semiconductor fabrication and processing has led to increased use of electroplating to deposit a variety of materials on semiconductor devices. Such materials include electroplated copper, nickel, and tin-silver alloys.

Electro-chemical plating (ECP) processes deposit a layer of material onto a substrate by electrolytic deposition, which a substrate is submerged into an electroplating solution comprising ions of a material to be deposited. A DC voltage is applied to the substrate to attract ions from the electroplating solution to the substrate, and the ions condense on the substrate to form a thin film.

In the ECP process, it is very difficult to control the filling ability of the small pattern gap and the large pattern gap at the same time. Typically, small pattern gaps require a strong suppressor and a fast bottom-up speed. However, strong inhibitors retard the bottom-up filling speed in the large pattern area, resulting in insufficient copper filling.

SUMMARY OF THE INVENTION

The present disclosure provides an improved electrochemical plating process that addresses the deficiencies and shortcomings of the prior art described above.

According to one aspect of the invention, a method of electro-chemical plating is disclosed. An electroplating apparatus comprises a plating chamber configured to contain an electrolyte and an anode while electroplating metal onto a substrate, wherein the substrate is coupled to an electrode configured to act as a cathode, and wherein the plating chamber comprises an anode chamber configured to contain anolyte and the anode, a cathode chamber configured to contain catholyte and the substrate, and a membrane separating the anode chamber from the cathode chamber. The catholyte is delivered to the cathode chamber. The catholyte is controlled at a first temperature before flowing into the cathode chamber. The anolyte is provided at room temperature. The temperature of the anolyte is lowered from the room temperature to a second temperature before delivering into the anode chamber. The second temperature is equal to or lower than the first temperature. The plating surface of the substrate is immersed in the electrolyte. The substrate is biased to a direct current (DC) voltage. The biased substrate attracts ions of the metal in the electrolyte toward the plating surface so as to electroplating the metal onto the substrate.

According to one embodiment, the first temperature is about 21° C.

According to one embodiment, the room temperature is 25° C. and the second temperature ranges between 19° C. and 21° C.

According to one embodiment, the substrate is a semiconductor wafer.

According to one embodiment, the substrate is positioned in a substrate holder.

According to one embodiment, the substrate holder comprises a clamshell that seals an edge and a backside of the substrate such that the electrolyte is prevented from contacting the edge and the backside of the substrate when it is immersed during a plating process.

According to one embodiment, the membrane is a cationic membrane configured for transporting water and the ions of the metal from the anolyte to the catholyte during the plating process.

According to one embodiment, the ions of the metal comprise cupric ($Cu^{2+}$) ions and the cupric ions are reduced into metallic copper on the plating surface of the substrate.

According to one embodiment, the anolyte comprises a virgin makeup solution (VMS) that is substantially free of organic additives.

According to one embodiment, the VMS comprises sulfuric acid and copper sulfate solution.

According to one embodiment, the catholyte comprises the VMS and the organic additives.

According to one embodiment, the organic additives comprise suppressors, accelerators, and/or levelers.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

In the following description, the terms "semiconductor wafer", "wafer" and "substrate" can be used interchangeably. The terms "plating liquid", "plating bath" and "plating solution" can be used interchangeably. Although the following embodiments are described by taking a semiconductor substrate or a wafer as an example, those skilled in the art should understand that the present invention can also be applied to other working pieces, such as magnetic recording media or optical components, and is not limited only to a semiconductor substrate or wafer.

One of the important applications of electrochemical plating (ECP) is to electroplate copper onto a semiconductor wafer to form conductive copper lines for "connecting" the various components of the integrated circuit. Typically, this plating process is used as a step in the copper damascene manufacturing process. A continuing problem in the electroplating process in modern VLSI wafer processes is the quality of the deposited metal film. Since the metal line width has reached the deep sub-micron level and the damascene trench typically has a very high aspect ratio, the plated film must be very uniform. They must have a uniform thickness on the surface of the wafer and must have consistent quality in multiple batches.

As mentioned above, it is very difficult to control the filling ability of the small pattern gap and the large pattern gap at the same time in the ECP process. Typically, small pattern gaps require a strong suppressor and a fast bottom-up speed. However, strong inhibitors retard the bottom-up filling speed in the large pattern area, resulting in insufficient copper filling. The present disclosure addresses this problem.

Figure 1:
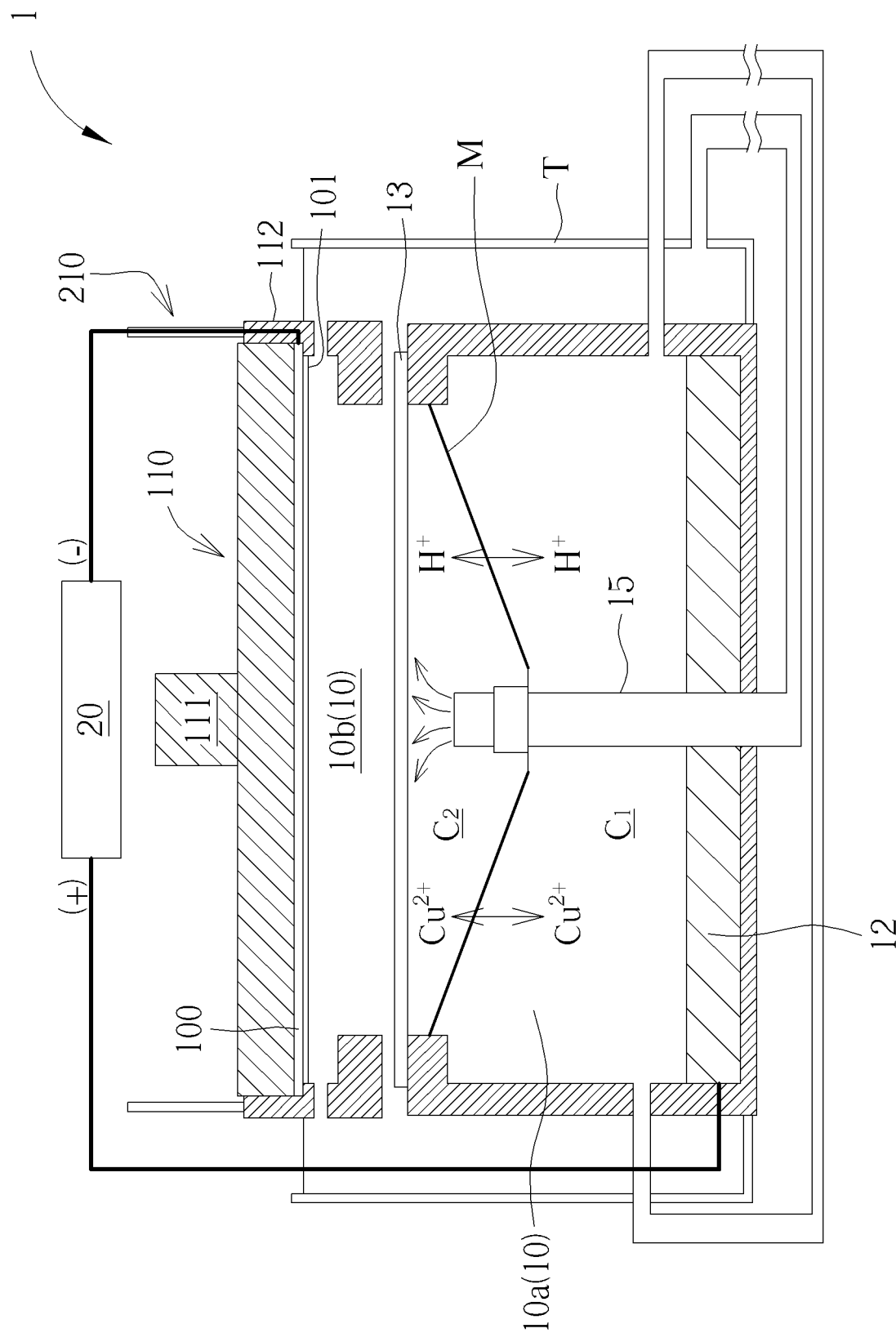
FIG. 1 is a simplified schematic diagram of a plating apparatus unit according to an embodiment of the invention.

Please refer to FIG. 1, which is a simplified schematic diagram of a plating apparatus unit according to an embodiment of the invention. Although FIG. 1 depicts only a single electroplating apparatus cell, those skilled in the art will appreciate that the electroplating system or electroplating station can have a plurality of electroplating apparatus units while permitting simultaneous electroplating of a plurality of wafers.

As shown in FIG. 1, an electroplating apparatus unit 1 is first provided, including a plating chamber T for accommodating a plating solution 10 and an anode 12 for plating a metal 101 onto a substrate 100. According to an embodiment of the invention, the substrate 100 is a semiconductor wafer or a workpiece. For example, the substrate 100 may be a 12-inch wafer, but is not limited thereto. According to an embodiment of the invention, the metal 101 may be the metal used in various elements or interconnects of a semiconductor integrated circuit, such as a gate, a plug or a copper damascene wire, etc. For example, the metal 101 may be copper metal, but is not limited thereto. According to an embodiment of the invention, the anode 12 is, for example, copper metal.

According to an embodiment of the invention, the substrate 100 is fixed on a substrate holder 110. According to an embodiment of the invention, the substrate holder 110 may include a liftable shaft 111 for rotating the substrate 100 fixed on the substrate holder 110 during the plating process. According to an embodiment of the present invention, the substrate holder 110 may include a clamshell member 112 that seals the edge and the back side of the substrate 100 to prevent the plating solution 10 from contacting the edge and back of the substrate 100 during the plating process. According to an embodiment of the invention, the substrate 100 is electrically connected to an electrode 210 configured as a cathode, which is connected to a negative terminal of a DC power supply 20. The DC power source 20 can control the current flowing to the substrate 100.

According to an embodiment of the invention, the plating chamber T includes an anode chamber $C_1$ configured to receive an anolyte 10a and the anode 12, a cathode chamber $C_2$ configured to receive a catholyte 10b and the substrate 100, and a membrane M that separates the anode chamber $C_1$ from the cathode chamber $C_2$. According to an embodiment of the invention, the membrane M may be an ion membrane or an ion exchange membrane configured to allow metal ions or other ions to be transported from the anolyte 10a to the catholyte 10b during the electroplating process. According to an embodiment of the present invention, the metal ions include copper ions ($Cu^{2+}$), and the copper ions are reduced to metallic copper on a plating surface of the substrate 100.

According to an embodiment of the invention, the anolyte 10a is a virgin makeup solution (VMS) free of organic additives. According to an embodiment of the invention, the VMS comprises a solution of sulfuric acid and copper sulfate. According to an embodiment of the invention, the catholyte comprises the VMS and an organic additive. According to an embodiment of the invention, wherein the organic additive comprises a suppressor, an accelerator, and/or a leveler.

In addition, according to an embodiment of the present invention, a high-resistance virtual anode (HRVA) 13 may be disposed between the membrane M and the substrate 100. For example, the high-impedance virtual anode 13 may be a dish structure made of an ion-resistive material such as polycarbonate, polyethylene, polypropylene, polyvinylidene fluoride (PVDF), polytetrafluoroethylene, polyfluorene or the like. The HRVA 13 may be disposed adjacent to the substrate 100. In accordance with embodiments of the present invention, the HRVA 13 can include a plurality of apertures that are isolated from one another and can be used to improve plating uniformity during electroplating.

According to an embodiment of the present invention, the plating solution 10, including the anolyte 10a and the catholyte 10b, is continuously supplied to the anode chamber $C_1$ and the cathode chamber $C_2$ through an external circulation system, respectively. Generally, the catholyte 10b can flow upward through the membrane M through the intermediate conduit 15 to the center of the HRVA 13, and then radially outward and across the HRVA 13, after passing through the HRVA 13, uniform flow along the surface of the substrate 100. The overflowed catholyte 10b is returned to the circulation system for filtration or treatment after collection in the overflow tank. The circulation of the catholyte 10b described above may be referred to as a "cathode loop". According to an embodiment of the present invention, the anolyte 10a can be supplied into the anode chamber $C_1$ from the sidewall of the plating chamber T through the external circulation system. The circulation of the above anolyte 10a may be referred to as an "anode loop".

Figure 2:
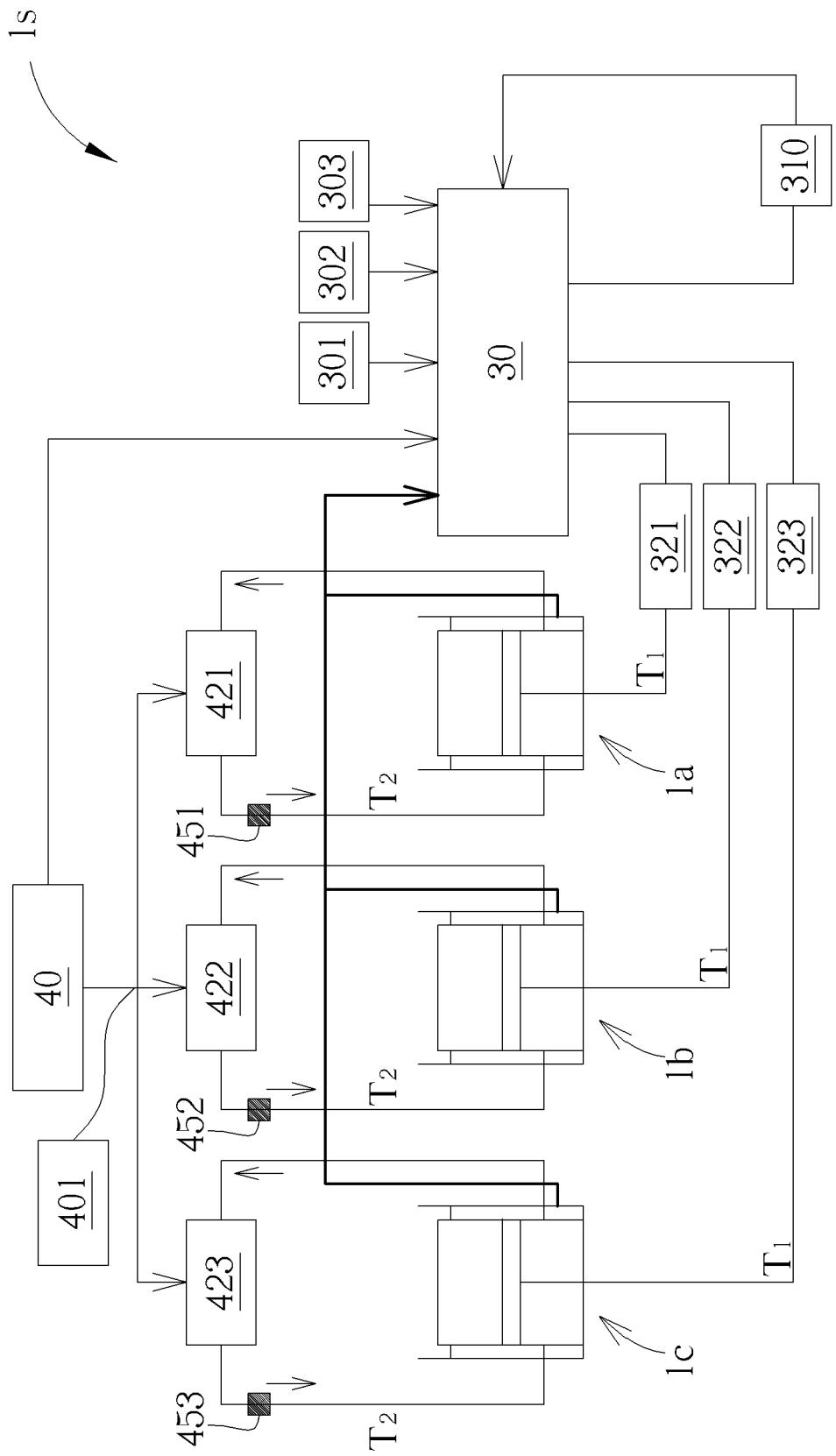
FIG. 2 is a schematic diagram of an electroplating system according to an embodiment of the invention.

Please refer to FIG. 2, which is a schematic diagram of an electroplating system according to an embodiment of the invention. As shown in FIG. 2, the plating system is includes a plurality of plating apparatus units 1a, 1b, 1c as shown in FIG. 1, in which the catholyte 10b of the plating apparatus units 1a, 1b, 1c are all collected through respective overflow tanks. After collection, it is pumped back to the central plating bath 30. The concentration of each component of the catholyte 10b in the central plating bath 30 (for example, copper ions, chloride ions, and acid) can be automatically detected by the detector 310, and the desired accelerator, suppressor and leveler can be added to the central plating bath 30 by the dose systems 301 to 303, respectively. The adjusted catholyte 10b is then transported to the plating apparatus units 1a to 1c via the pumps 321 to 323, respectively, to thereby constitute a "cathode loop".

According to an embodiment of the present invention, in the process of transporting the catholyte 10b to the cathode chamber of the plating apparatus units 1a to 1c, the catholyte 10b is controlled at a first temperature $T_1$, wherein the first temperature $T_1$ is, for example, 21° C. According to an embodiment of the present invention, the control of the first temperature $T_1$ may be performed by providing a heat exchanger in the central plating bath 30 such that the catholyte 10b is controlled at the first temperature $T_1$ before flowing into the cathode chambers of the respective plating apparatus units 1a to 1c. T1.

In accordance with an embodiment of the present invention, the electroplating system 1s includes a VMS supply system 40 that provides the anolyte 10a at room temperature (about 25° C.). The anolyte 10a of the anode chamber of each of the plating apparatus units 1a to 1c is circulated by the respective pumps 421 to 423, and is adjusted by a VMS automatic dosing unit 401, thereby constituting an "anode loop". According to an embodiment of the present invention, for example, chillers 451 to 453 are respectively disposed on the outlet lines of the respective pumps 421 to 423, and before the anolyte 10a is delivered to the anode chambers of the respective plating apparatus units 1a to 1c, the temperature of the anolyte 10a is lowered from room temperature to a second temperature $T_2$, wherein the second temperature $T_2$ is equal to or lower than the first temperature $T_1$. According to an embodiment of the invention, for example, the second temperature $T_2$ is between 19° C. and 21° C.

As shown in FIG. 1 and FIG. 2, after the temperature control of the "anode loop" is completed, the surface to be plated of the substrate 100 is immersed in the plating solution 10, and the substrate 100 is biased to a DC voltage, wherein the biased substrate 100 attracts metal ions (e.g., copper ions) in the plating solution to the surface to be plated to electroplate a metal (e.g., copper) onto the substrate 100.

The main feature of the present invention is that the temperature of the "anode loop" is precisely controlled, and the temperature of the anolyte 10a is lowered from the original room temperature to a second temperature $T_2$, wherein the second temperature $T_2$ is equal to or lower than the first temperature $T_1$ of the catholyte 10b, so that the problem of insufficient copper filling of a large pattern when a thick metal film is to be plated on the substrate can be avoided. Furthermore, the advantage of using the method of the invention is that the production can be carried out simultaneously with the electroplating equipment units 1a to 1c, maximizing the production capacity and throughput.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of electro-chemical plating, comprising:
    providing an electroplating apparatus comprising a plating chamber configured to contain an electrolyte and an anode while electroplating metal onto a substrate, wherein the substrate is coupled to an electrode configured to act as a cathode, and wherein the plating chamber comprises an anode chamber configured to contain anolyte and the anode, a cathode chamber configured to contain catholyte and the substrate, and a membrane separating the anode chamber from the cathode chamber;
    delivering the catholyte to the cathode chamber, wherein the catholyte is controlled at a first temperature before flowing into the cathode chamber;
    providing the anolyte at room temperature and lowering the temperature of the anolyte from the room temperature to a second temperature before delivering into the anode chamber, wherein the second temperature is equal to or lower than the first temperature;
    immersing a plating surface of the substrate in the electrolyte; and
    biasing the substrate to a direct current (DC) voltage, wherein the biased substrate attracts ions of the metal in the electrolyte toward the plating surface so as to electroplating the metal onto the substrate.

2. The method according to claim 1, wherein the first temperature is about 21° C.

3. The method according to claim 2, wherein the room temperature is 25° C. and the second temperature ranges between 19° C. and 21° C.

4. The method according to claim 1, wherein the substrate is a semiconductor wafer.

5. The method according to claim 1, wherein the substrate is positioned in a substrate holder.

6. The method according to claim 5, wherein the substrate holder comprises a clamshell that seals an edge and a backside of the substrate such that the electrolyte is prevented from contacting the edge and the backside of the substrate when it is immersed during a plating process.

7. The method according to claim 6, wherein the membrane is a cationic membrane configured for transporting water and the ions of the metal from the anolyte to the catholyte during the plating process.

8. The method according to claim 1, wherein the ions of the metal comprise cupric ($Cu^{2+}$) ions and the cupric ions are reduced into metallic copper on the plating surface of the substrate.

9. The method according to claim 1, wherein the anolyte comprises a virgin makeup solution (VMS) that is substantially free of organic additives.

10. The method according to claim 9, wherein the VMS comprises sulfuric acid and copper sulfate solution.

11. The method according to claim 10, wherein the catholyte comprises the VMS and the organic additives.

12. The method according to claim 10, wherein the organic additives comprise suppressors, accelerators, and/or levelers.

* * * * *